United States Patent [19]

Dohya

[11] Patent Number: 4,628,149
[45] Date of Patent: Dec. 9, 1986

[54] SUBSTRATE HAVING A PATTERN OF AN ALLOY OF GOLD AND A NOBLE AND A BASE METAL WITH THE PATTERN ISOLATED BY OXIDES OF THE NOBLE AND THE BASE METALS

[75] Inventor: Akihiro Dohya, Tokyo, Japan

[73] Assignee: Nippon Electric Co., Ltd., Tokyo, Japan

[21] Appl. No.: 444,097

[22] Filed: Nov. 24, 1982

[30] Foreign Application Priority Data

Nov. 30, 1981 [JP] Japan ................... 56-190518
May 17, 1982 [JP] Japan ................... 57-82917

[51] Int. Cl.$^4$ ............................................. H05K 1/09
[52] U.S. Cl. ........................... 174/68.5; 361/402; 361/411; 420/508; 428/601
[58] Field of Search ............ 361/402, 411; 420/417, 420/508, 509, 510; 428/601; 174/68.5

[56] References Cited

U.S. PATENT DOCUMENTS

| | | | |
|---|---|---|---|
| 2,780,543 | 2/1957 | Schneider et al. | 420/508 X |
| 3,386,894 | 6/1968 | Steppat | 204/15 |
| 3,621,442 | 11/1971 | Racht | 361/402 X |
| 3,663,279 | 5/1972 | Lepselter | 428/601 X |
| 4,014,689 | 3/1977 | Horst et al. | 420/417 X |
| 4,109,297 | 8/1978 | Lesh et al. | 361/402 |
| 4,434,544 | 3/1984 | Dohya et al. | 174/68.5 X |

FOREIGN PATENT DOCUMENTS 56-49535  5/1981  Japan ................... 420/508

OTHER PUBLICATIONS

Titanium Project, The Manufacture of Ductile Titanium, Nov. 1947 by Mallory & Co., Indianapolis, Ind.

Primary Examiner—R. R. Kucia
Attorney, Agent, or Firm—Sughrue, Mion, Zinn, Macpeak, and Seas

[57] ABSTRACT

In a wired substrate, a conductive pattern is formed of an alloy of gold, a base matal, and a noble metal and is contiguous to an insulating layer of a mixture of oxides of the base and the noble metals. The alloy preferably includes the base and the noble metals to a total amount of 0.2 to 2 percent by weight. More preferably, the base metal is titanium, aluminium, or copper. The noble metal is palladium, ruthenium, rhodium, or nickel. The wired substrate is manufactured by forming a first layer of the base metal, a second layer of the noble metal, and a selectively formed gold layer successively on the substrate and by heat treating at least the first, the second, and the gold layers to convert the gold layer and those portions of the first and the second layers on which the gold layer is formed, to the conductive pattern and to concurrently convert other portions of the first and the second layers to the insulating layer. The first, the second, and the gold layers are preferably 0.025 to 0.4, 0.025 to 0.3, and 1 to 10 microns thick, respectively. When the base and the noble metals are titanium and palladium, respectively, the heat treatment is carried out in air at 850° to 950° for 5 to 10 minutes.

4 Claims, 4 Drawing Figures

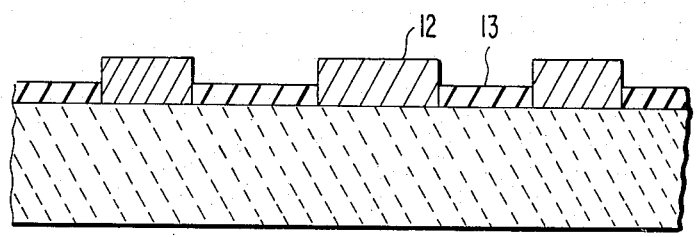
FIG. 1
FIG. 2A
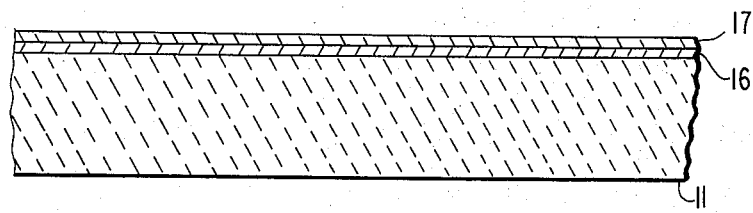
FIG. 2B
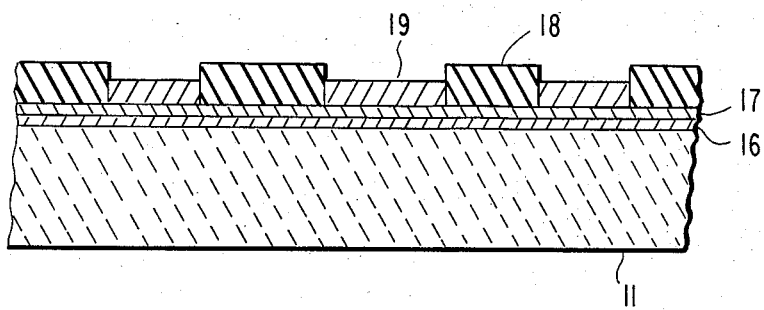
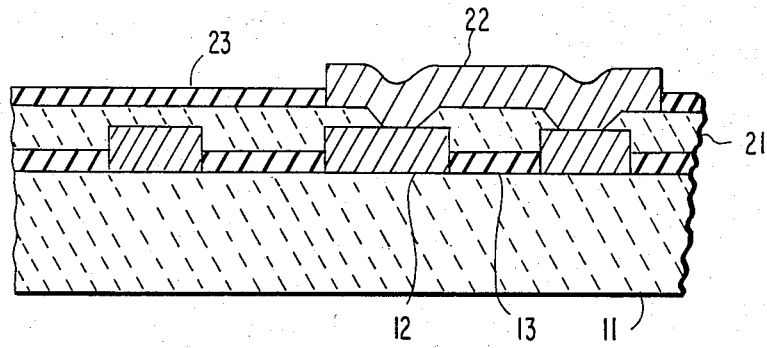
FIG. 3

SUBSTRATE HAVING A PATTERN OF AN ALLOY OF GOLD AND A NOBLE AND A BASE METAL WITH THE PATTERN ISOLATED BY OXIDES OF THE NOBLE AND THE BASE METALS

BACKGROUND OF THE INVENTION

This invention relates to a wired substrate and a method of manufacturing the same. In particular, this invention is suitable for manufacturing of LSI's used in communications installations and data processing apparatus.

Various structures are already known for wires substrates, which are referred to also as printed circuits. A number of methods have been invented for fabricating a conductive or wiring pattern on a background surface to provide a wire substrate. Ordinarily, semiconductor devices are preliminarily formed in the substrate.

In U.S. Pat. No. 3,461,347 issued to Jerome H. Lemelson, a printed circuit assembly is disclosed in which a metallic pattern formed on an insulative base is electrically isolated by contiguous dielectric portions made of a nonconductive oxide of the metal of the pattern. The electrical assembly of the type revealed by Lemelson has contributed much to manufacture of IC's. The structure is, however, defective when applied to fabrication of LSI's. This is because it is necessary according to the technique exemplified by the teaching of Lemelson that the metal be a base metal, such as aluminium, which can be anodized. The conductive pattern of such a base metal is liable to oxidation and corrosion which adversely affects the reliability of LSI's.

In U.S. Pat. No. 3,386,894 issued to Christian Heinrich Maximilian Steppat, a method is revealed for manufacturing wired substrates by selective plating and etching. At first, a first sublayer of a first conductive material is formed on a background surface. A second sublayer of a second conductive material is then formed on the first sublayer. A further conductive material is selectively electrodeposited on the second sublayer by using a photoresist. After the photoresist is removed, the second sublayer is selectively etched by using the selectively plated conductive material as a masking layer. Subsequently, the first sublayer is converted to a nonconductive layer at portions where the second sublayer has been etched away. The conductive pattern is formed of three layers, typically titanium, silver, and gold layers successively stacked on the background surface. The first sublayer should be highly adherent to the background surface and convertible to the nonconductive portions.

The method disclosed by Steppat is also inadequate for application to manufacture of LSI's. This is because the second sublayer is inevitably side etched. The side etch results from the so-called galvanic corrosion which occurs when different metals are in contact with each other in an electrolyte solution, such as an etching solution. As a result of the side etch, the stacked layers are no longer tenaciously adherent to each other when a conductive pattern has a narrow pattern width, e.g. 50 microns or less. Moreover, it is not feasible to render the pattern width narrower than 20 microns.

In U.S. Pat. No. 3,663,279 issued to Martin P. Lepselter, a method is disclosed for fabricating a conductive pattern on a semiconductor body. According to Lepselter, a first layer of a first metal is formed on the semiconductor body. A second layer of a second metal is formed on the first layer. The second layer may comprise two sublayers. By using a photoresist, the second layer is selectively etched. After removal of the photoresist, the first layer is oxidized at portions where the second layer has been selectively etched away. The entire exposed surface of the oxidized first layer and of the remainder of the second layer is covered with a passivation film.

Inasmuch as the photoresist is used, galvanic corrosion does not take place when the second layer is formed only of a single metal. However, a small amount of side etch, such as 1 to 2 microns, is unavoidable. In an embodiment of the invention of Lepselter, the first layer consists of zirconium. A platinum layer is formed on the zirconium layer as one of the sublayers. after selective etch of the platinum layer, a gold layer is selectively plated on the remaining platinum layer as another sublayer. With this structure, adhesion between the platinum and the gold layers becomes weak when the pattern width is 5 microns or narrower.

In an article contributed by A. Pfahnl et al to "The Solid Films," 13 (1972), pages 51–55, under the title of "Preparation and Properties of Beam Crossovers for Interconnections in Thin Film Circuits," a method is described for preparing beam crossovers. With respect to a conductive pattern, a titanium and a palladium layer are successively formed on a glass or ceramic substrate. Gold is selectively plated on the palladium layer by using a photoresist. After removal of the photoresist, the titanium and the palladium layers are selectively etched by using the selectively plated gold layer as an etching resist. The side etch of the palladium layer in the conductive pattern amounts to 7 to 10 microns on each side of the pattern when the palladium layer is 0.1 micron thick. Decreased adhesion between the conductive layers becomes a problem when the pattern width is 50 microns or narrower. It is impossible to provide a conductive pattern having a 20-micron or narrower pattern width.

In an article contributed by K. V. Heber to "Journal of the Electrochemical Society," Volume 120, No. 10 (October 1973), Technical Notes, pages 1434–1435, and entitled "A Technique for Anodizing IC Aluminium Layers," an arrangement is described for contact of an electrode to an aluminium layer. The electrode is for selectively anodizing adjacent portions of the aluminium layer and is housed in a suction pad made of silicone rubber and having a meniscus surface. The materials for the conductive pattern and the contiguous insulating layer are not different from those used in the above-referenced Lemelson patent. The pad is from 3 to 5 mm in diameter.

SUMMARY OF THE INVENTION

It is therefore an object of the present invention to provide a wired substrate which is not deteriorated by oxidation and/or corrosion but is highly reliable.

It is another object of this invention to provide a wired substrate of the type described, in which adhesion between layers is not adversely affected by side etch.

It is still another object of this invention to provide a wired substrate of the type described, which comprises a conductive pattern of as narrow a pattern width as, for example, several microns or less.

It is a further object of this invention to provide a method of manufacturing a wired substrate of the type described.

It is possible to specify a wired substrate to which this invention is applicable, as comprising a substrate having an insulating surface, a conductive pattern directly on the insulating surface, and an insulating layer which lies directly on the insulating surface and contiguous to the conductive pattern and is thinner than the conductive pattern. According to this invention, the conductive pattern is formed of an alloy consisting essentially of gold, a base metal, and a noble metal with the base and the noble metals included in the alloy in a total amount less than the gold. The noble metal should be other than gold. The insulating layer is formed of oxides of the base and the noble metals.

It is possible to specify a method of manufacturing a wired substrate to which this invention is applicable, as comprising the steps of providing a substrate having an insulating surface, forming a conductive pattern on the insulating surface, and forming an insulating layer on the insulating surface and contiguous to the conductive pattern. According to this invention, the step of forming the conductive pattern and the insulating layer comprise the steps of forming a first layer of a base metal directly on the insulating surface, forming a second layer of a noble metal directly on the first layer, forming a third layer of gold selectively directly on the second layer to a thickness which is thicker than a total thickness of the first and the second layers, and heat treating at least the first through the third layers to convert the third layer and selected portions of the first and the second layers to the conductive pattern and to concurrently convert remaining portions of the first and the second layers to the insulating layer. The selected portions are those portions of the first and the second layers on which the third layer is formed. The remaining portions are those portions of the first and the second layers which are other than the selected portions. The conductive pattern is thereby formed of an alloy of the gold, the base metal, and the noble metal. The noble metal should be other than gold. The insulating layer is thereby formed of oxides of the base and the noble metals.

BRIEF DESCRIPTION OF THE DRAWING

FIG. 1 is a schematic vertical sectional view of a wired substrate according to a first embodiment of the instant invention;

FIGS. 2A and 2B show, in schematic vertical section, steps of manufacturing the wired substrate depicted in FIG. 1; and FIG. 3 is a schematic vertical sectional view of a wired substrate according to a second embodiment of this invention.

DESCRIPTION OF THE PREFERRED EMBODIMENT

Referring to FIG. 1, a wired substrate according to a first embodiment of the present invention comprises a substrate 11 having an insulating surface. Preferably, the substrate 11 is formed of a refractory insulating material, such as alumina, at least at a portion including the insulating surface. In the manner which will become clear as the description proceeds, a conductive layer 12 is formed directly on desired areas of the insulating surface. The desired areas should be in conformity with a geometrical configuration or pattern for a wiring. Moreover, an insulating layer 13 is formed directly on those other areas of the insulating surface, on which the conductive layer or pattern 12 is not formed. The conductive pattern 12 is contiguous to the insulating layer 13 on the insulating surface. Like the conductive pattern of the wired substrate according either to the Steppat or the Lepselter patent referred to hereinabove, the insulating layer 13 is thinner than the conductive pattern 12.

The conductive pattern 12 is made of a gold alloy including a small total amount of titanium and palladium. Preferably, the total amount is selected between about 0.2 and 2 percent by weight of the alloy. The preferred gold alloy has electrical characteristics which are substantially identical with those of gold.

The insulating layer 13 is made of oxides of titanium and palladium. More particularly, the insulating layer 13 is formed of a mixture of titanium and palladium oxides. The mixture has excellent electrical insulating characteristics and does not degrade the electrical isolation between two adjacent conductive patterns of the conductive layer 12. The table shown below exhibits the fact that the electric insulation is not adversely affected by the presence of the insulating layer 13. The insulation was measured in ohm for a 0.1-micron thick insulating layer 13 by applying 10 volts between two 150-micron spaced apart conductive patterns, each 2.5 mm long.

TABLE

| Sample | With Layer 13 | Without Layer 13 |
| --- | --- | --- |
| 1 | $1.0 \times 10^9$ | $1.5 \times 10^9$ |
| 2 | $1.5 \times 10^9$ | $1.5 \times 10^9$ |
| 3 | $1.0 \times 10^9$ | $1.5 \times 10^9$ |
| 4 | $1.5 \times 10^9$ | $0.8 \times 10^9$ |
| Average | $1.25 \times 10^9$ | $1.33 \times 10^9$ |

Referring to FIG. 2A, a method of manufacturing a wired substrate illustrated with reference to FIG. 1 is carried out by forming at first a thin titanium film 16 and a thin palladium film 17 successively on the insulating surface of the substrate 11. It is possible to form the films 16 and 17 either by sputtering or by vacuum evaporation. It is preferred that each of the films 16 and 17 should have a thickness as will presently be described.

Turning to FIG. 2B, a masking layer 18 is formed of a photoresist on the palladium film 17 to leave an exposed area of the palladium film 17 in conformity with the conductive pattern 12. A gold layer 19 is plated on the exposed surface of the palladium film 17. The gold layer 19 should have a thickness determined in compliance with the requirements for the conductive pattern 12. The preferred thickness is between about 1 and 10 microns. An assembly thus formed is subjected to heat treatment in an oxidizing atmosphere. For example, the heat treatment is carried out in air at an elevated temperature between about 850° C. and 950° C. for an oxidizing time duration between 5 and 10 minutes. It is usual that the elevated temperature is reached in about half an hour, during which the photoresist is completely burnt off to expose those uncovered portions of the palladium film 17 which are not covered with the gold layer 19. During the oxidizing time duration, the titanium and the palladium diffuse into the gold from those "selected portions" of the titanium and the palladium films 16 and 17 on which the gold layer 19 is formed. The diffusion provides an alloy consisting essentially of gold, titanium, and palladium. Concurrently, the titanium and the palladium are converted to their respective oxides at those "remaining portions" of the titanium and the palladium films 16 and 17 which are other than the selected portions. In addition, the titanium and the palladium oxides diffuse into each other.

It may now be understood that the conductive layer or pattern 12 is formed from the gold layer 19 and the selected portions of the titanium and the palladium films 16 and 17. The conductive pattern 12 is formed of the alloy including titanium and palladium which comes from the selected portions. The insulating layer 13 is formed from the remaining portions which are converted to a mixture of the titanium and the palladium oxides. The content of the titanium and the palladium in the alloy is determined by the thicknesses of the titanium and the palladium films 16 and 17 and the gold layer 19.

Preferably, the titanium film 16 has a thickness selected between about 0.025 and 0.2 micron. The palladium film 17 has a thickness selected between about 0.025 and 0.2 micron. The titanium film 16 can be rendered as thick as 0.4 micron without any adverse effects on the wired substrate manufactured by the method, as illustrated with reference to FIGS. 2A and 2B. On the other hand, the palladium film 17 should not be thicker than about 0.3 micron because oxidation of the remaining portions of the titanium and the palladium films 16 and 17 and diffusion of the titanium and the palladium oxides into each other, are otherwise adversely affected. The titanium film 16 may or may not have a thickness which is equal to the thickness of the palladium film 17. It is preferred that the titanium and the palladium films 16 and 17 have thicknesses relative to the thickness of the gold layer 19 sufficient to make the alloy include the titanium and the palladium to a total amount selected between about 0.2 and 2 percent by weight as described heretobefore. It is preferred in general that the titanium and the palladium films 16 and 17 have a total thickness of about 0.1 micron when the gold layer 19 is from 1 to 10 microns thick.

As seen from the description relating to FIGS. 2A and 2B, it is possible to manufacture the wired substrate illustrated in FIG. 1 without an etching process. Consequently, the wired substrate is not deteriorated by side etch. The narrowest possible pattern width depends solely on the resolution of the photoresist and is readily rendered as narrow as several microns or even as a fraction of micron. It is acknowledged that the structure of layers or films is similar to that described in the Pfahnl et al article cited heretobefore. The similarity is, however, only before the heat treatment.

Referring to FIG. 3, a wired substrate according to a second embodiment of this invention comprises a substrate 11 having an insulating surface, a first conductive layer 12 directly on the insulating surface, and a first insulating layer 13 which lies directly on the insulating surface and contiguous to the first conductive layer 12 and is thinner than the first conductive layer 12. The first conductive layer 12 has a geometric configuration conforming to a first conductive pattern. An insulating cover 21 is formed on the insulating layer 13 and on the conductive layer 12 except at contact portions where contact should be formed to the first conductive layer 12. A second conductive layer 22 is formed directly on the insulating cover 21 in accordance with a second conductive pattern to be brought into contact with the first conductive layer 12 at the contact portions. In cooperation with the first conductive pattern and the contact portions, the second conductive pattern forms an overall conductive pattern for a wiring. A second insulating layer 23 is formed directly on those other portions of the insulating cover 21, on which the second conductive layer or pattern 22 is not formed. The second insulating layer 23 is contiguous to the second conductive pattern 22.

The insuating cover 21 is formed of an inorganic insulating material as by sintering a mixture of glass powder and alumina powder in the manner known in the art, which glass includes silicon dioxide as the principal constituent. The second conductive and insulating layers 22 and 23 are formed like the first conductive and insulating layers 12 and 13 as described in conjunction with FIGS. 1, 2A, and 2B.

While a few preferred embodiments of this invention have thus far been described with reference to FIGS. 1 through 3, it will now readily be possible for a person skilled in the art to carry this invention into effect in various other manners. For example, a wired substrate may have three or more layers of wirings. It is possible to substitute another base metal for the titanium and another noble metal for the palladium. A very fine conductive pattern is obtained by the structure according to this invention, wherein a conductive pattern of a gold alloy is formed on an insulating background with the gold alloy made to consist essentially of gold, a small amount of a base metal, and another small amount of another noble metal and with those other areas of the background covered with an insulating layer formed of a mixture of oxides of the base and the noble metals, on which the conductive pattern is not formed. By way of example, the base metal may be selected from a group consisting of titanium, aluminum, and copper. The noble metal may be selected from a group consisting of palladium, ruthenium, rhodium, and nickel. It is to be noted that copper and nickel are herein classified into the base and the noble metals, respectively.

What is claimed is:

1. A wired substrate comprising a substrate having an insulating surface, a conductive pattern directly on said insulating surface, and an insulating layer which lies directly on said insulating surface and contiguous to said conductive pattern and is thinner than said conductive pattern, wherein said conductive pattern is formed of an alloy consisting essentially of gold, a first metal selected from the group consisting of titanium, aluminum and copper and a second metal selected from the group consisting of palladium, ruthenium and rhodium, said first and second metals being included in said alloy in a total amount less than said gold and said insulating layer is formed of a mixture of oxides of said first and second metals.

2. A wired substrate as claimed in claim 1, wherein said total amount of said first and second metals is between about 0.2 to 2 percent by weight of said alloy.

3. A wired substrate as claimed in claim 1, wherein said first and said second metals are titanium and palladium, respectively.

4. A wired substrate as claimed in claim 3, wherein said conductive pattern has a thickness between about 1 and 10 microns and said insulating layer has a thickness between about 0.05 and 0.4 micron.

* * * * *